United States Patent
Chidiac et al.

(10) Patent No.: US 10,415,354 B2
(45) Date of Patent: Sep. 17, 2019

(54) SYSTEMS AND METHODS FOR ASSESSING PRODUCTION AND/OR INJECTION SYSTEM STARTUP

(71) Applicant: ONESUBSEA IP UK LIMITED, London (GB)

(72) Inventors: Cedric El Chidiac, Houston, TX (US); Sarah Rae Kunz, Sugar Land, TX (US); Robert Edward Sauve, Katy, TX (US); Tobias Voelkel, Katy, TX (US); Burkhard Sommer, Houston, TX (US)

(73) Assignee: ONESUBSEA IP UK LIMITED, London, England (GB)

( * ) Notice: Subject to any disclaimer, the term of this patent is extended or adjusted under 35 U.S.C. 154(b) by 398 days.

(21) Appl. No.: 15/257,694

(22) Filed: Sep. 6, 2016

(65) Prior Publication Data
US 2018/0066501 A1   Mar. 8, 2018

(51) Int. Cl.
*G06F 17/50* (2006.01)
*E21B 43/16* (2006.01)
(Continued)

(52) U.S. Cl.
CPC .......... *E21B 43/16* (2013.01); *E21B 41/0007* (2013.01); *E21B 43/01* (2013.01); *G06F 17/5009* (2013.01)

(58) Field of Classification Search
CPC ...... E21B 43/16; E21B 41/0007; E21B 43/01; G06F 17/5009
(Continued)

(56) References Cited

U.S. PATENT DOCUMENTS 7,137,451 B2 * 11/2006 Smith ................. E21B 33/0355
166/335
7,967,066 B2 * 6/2011 McStay ................. E21B 33/035
166/250.01
(Continued)

FOREIGN PATENT DOCUMENTS

GB    2458205 A    9/2009

OTHER PUBLICATIONS

Guiqing Han, Kegang Ling, Siew Hiang Khor, He, Zhang, Ram Kinkar Thankur, "Simulation of Multiphase Fluid-Hammer Effects During Well Startup and Shut-in", SPE 160049, Oil and Gas Facilities, Dec. 2013, pp. 68-77.*
(Continued)

*Primary Examiner* — Dwin M Craig
(74) *Attorney, Agent, or Firm* — Fletcher Yoder, P.C.

(57) ABSTRACT

A method of modeling effects of operational procedures during startup of a fluid production or injection system at a field includes determining initial conditions of the field at a first time based on field measurements of the field. The method also includes simulating startups of the fluid production or injection system based on the initial conditions. The method further includes determining operational procedures for starting up the fluid production or injection system based on the simulated startups. The method also includes determining whether a startup command has been received. The method further includes sending instructions to startup the fluid production or injection system using the operational procedures when the startup command is received.

20 Claims, 7 Drawing Sheets

(51) Int. Cl.
 *E21B 43/01* (2006.01)
 *E21B 41/00* (2006.01)
(58) Field of Classification Search
 USPC .............................................................. 703/9
 See application file for complete search history.

(56) References Cited

U.S. PATENT DOCUMENTS

| | | | |
|---|---|---|---|
| 8,517,112 B2* | 8/2013 | Niemeyer | E21B 34/16 |
| | | | 166/250.01 |
| 8,757,270 B2* | 6/2014 | Stenevik | E21B 43/017 |
| | | | 166/345 |
| 9,720,421 B2* | 8/2017 | Kleine | H04L 67/1095 |
| 2007/0192072 A1 | 8/2007 | Cullick et al. | |
| 2010/0207783 A1* | 8/2010 | Davis | E21B 33/0355 |
| | | | 340/854.9 |
| 2012/0095733 A1* | 4/2012 | Rossi | E21B 43/00 |
| | | | 703/2 |
| 2015/0337631 A1 | 11/2015 | Matringe et al. | |

OTHER PUBLICATIONS

GB Extended European Search Report for EP Application No. 17189651.7 dated May 29, 2018; 7 pgs.

* cited by examiner

SYSTEMS AND METHODS FOR ASSESSING PRODUCTION AND/OR INJECTION SYSTEM STARTUP

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

The present disclosure relates generally to determining a startup time of a fluid production and/or injection system. More particularly, the present disclosure relates to using integrated modeling to accurately assess and effectively adjust a startup time schedule of a fluid production and/or injection system.

Offshore oil and gas fields produce a significant portion of the world's oil and gas supply. Technological advances have enabled producing hydrocarbons from subsea (e.g., deepwater) fields. Subsea production systems may transport hydrocarbons from a subsea reservoir up to a delivery point (e.g., on or near the water surface or onshore earth surface). The production systems may range in complexity, for example, from a satellite well with a flowline linked to a platform, to multiple wells coupled to manifolds and subsea processing facilities which produce hydrocarbons to a fixed or floating facility, pipeline, or an onshore installation. Starting production or operation of a single well of a production system can be a time-consuming task (e.g., on a scale of approximately five to twenty or more hours). With the increasing size and complexity of production systems that include multiple wells, startup may use even more time, leading to operational inefficiencies and unproductive wait time.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The workflow discussed in the present disclosure determines and reduces startup time of a fluid production and/or injection system. At the center of the workflow, a dynamic integrated model is used to accurately assess and effectively adjust startup time schedule of the fluid production and/or injection system. The dynamic integrated model evaluates a dynamic response of a large field startup by integrating a reservoir model to a transient network model. The overall workflow incorporates equipment, field design, control systems, and simulation to generate a complete system capable of handling quick efficient field startups throughout the field life.

The present disclosure relates to an integrated workflow that models startup of a fluid production system. In particular, the integrated workflow includes a dynamic integrated asset model that incorporates fluid production and/or injection equipment at a fluid reservoir in a field. The integrated workflow may transiently model effects of operational procedures during the startup of a production system at different times throughout the life of the field. As such, the dynamic integrated model may be used to design the production system. The dynamic integrated model may also be used to model, improve, and/or monitor the field when the production system is in operation. Based on the modeled and/or monitored aspects of the field during production, the integrated workflow identifies potential inefficiencies that may occur during startup and provides mitigation and/or operational procedures to be performed based on changing reservoir productivity and/or constraints imposed by a facility (e.g., a fixed facility, a floating facility, or an onshore installation), a well, and/or a network of wells.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various features, aspects, and advantages of the present disclosure will become better understood when the following detailed description is read with reference to the accompanying figures in which like characters represent like parts throughout the figures, wherein.

DETAILED DESCRIPTION

Figure 1:
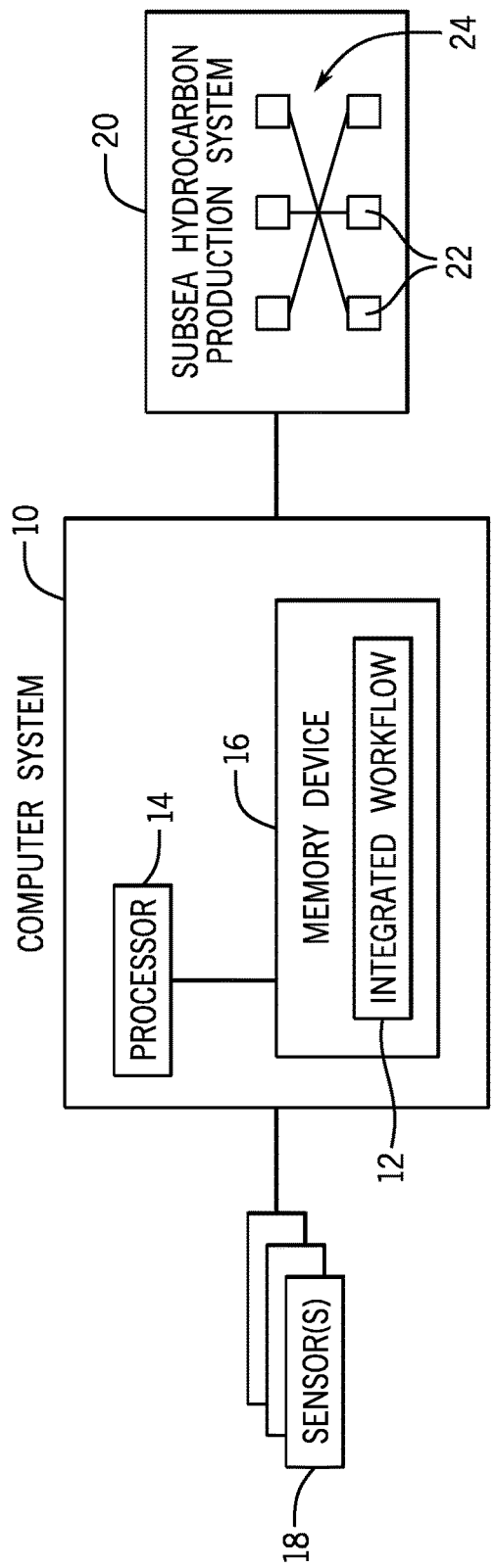
FIG. 1 is a block diagram of an example computer system that may generate and/or implement the integrated workflow, in accordance with one or more embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The drawing figures are not necessarily to scale. Certain features of the embodiments may be shown exaggerated in scale or in somewhat schematic form, and some details of conventional elements may not be shown in the interest of clarity and conciseness. Although one or more embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to intimate that the scope of the disclosure, including the claims, is limited to that embodiment.

When introducing elements of various embodiments of the present disclosure, the articles "a," "an," and "the" are intended to mean that there are one or more of the elements. The terms "comprising," "including," "incorporating," and "having" are used in an open-ended fashion, and thus should be interpreted to mean "including, but not limited to . . . ." Any use of any form of the terms "connect," "engage," "couple," "attach," "mate," "mount," or any other term describing an interaction between elements is intended to mean either an indirect or a direct interaction between the elements described. Moreover, any use of "top," "bottom," "above," "below," "upper," "lower," "up," "down," "vertical," "horizontal," "left," "right," and variations of these terms are made for convenience, but does not require any particular orientation of the components.

Certain terms are used throughout the description and claims to refer to particular features or components. As one skilled in the art will appreciate, different persons may refer to the same feature or component by different names. This document does not intend to distinguish between components or features that differ in name but not function, unless specifically stated.

During an unplanned shutdown of a fluid production and/or injection system in a field (e.g., a subsea hydrocarbon field), the operator may have a threshold time (e.g., approximately two to three hours, or more or less) to fix a problem causing the unplanned shutdown and startup the production system. If the operator has not fixed the problem causing the unplanned shutdown before the threshold time is exceeded, the operator may preserve a current operating status of the field (e.g., the current operating status of the field at the time the unplanned shutdown occurs) for a period of days or even weeks after the threshold time has exceeded—which may have costly consequences due to stoppage of production and other reasons. Starting up the production system is particularly inefficient for large offshore developments which may include multiple wells (e.g., on the order of ten, twenty, fifty, or more) coupled to manifolds and which may use days or weeks for startup, during which time the wells do not produce hydrocarbons and revenues are thus reduced.

As such, embodiments of the present disclosure relate to an integrated workflow that models startup of a production system in a field. In particular, the integrated workflow of the present disclosure may include a dynamic integrated asset model that incorporates predictive and/or optimization modeling of the operation of fluid production and/or injection equipment connected to a reservoir (e.g., a subsea hydrocarbon reservoir). The integrated workflow may transiently model effects of operational procedures during the startup of the production system and at different times throughout the life of the field. As such, the dynamic integrated asset model of the integrated workflow may be used to design the production system in view of the anticipated operations of the production system for the life of the field. The dynamic integrated asset model may also be used to model and/or monitor the field when the production system is in operation. As such, the integrated workflow of the present disclosure may identify potential inefficiencies that may occur during startup and provide mitigation and/or operational procedures to be performed based on changing reservoir productivity and/or constraints imposed by a processing facility (e.g., a fixed or floating facility or an onshore installation), a hydrocarbon well, a network of hydrocarbon wells, and the like. The mitigation and/or operational procedures may include, as non-limiting examples, design parameters in a startup sequence(s) for a well(s) and/or a drill center(s), an amount of chemical injection used to mitigate hydrate formation, a flow rate(s) limit per well, accumulation of a water, oil, or condensate in a pipeline(s) ("slugging"), equipment capacity constraints ("slug catcher"), and the like.

The integrated workflow of the present disclosure is based on a dynamic integrated asset model, which may be used to identify and adjust factors that may affect the field and how these factors may affect each other during production system startup and/or when the production system is in operation. The productivity (also referred to as a potential) of the field and of each individual well therein may be simulated using a reservoir model. These productivities may be input to (i.e., fed into) a production network model, which may be determined using a transient multiphase flow simulator, to identify flow assurance and operational issues that may affect the startup of the production system. Similarly, the production network model is coupled to and constrained by a surface facility model, which may be determined using a process simulator. The dynamic integrated asset model may thus be used to evaluate fluid production and/or injection control system(s) (e.g., electric, hydraulic, and/or mechanical, individually (e.g., all-electric) or in any hybrid combination thereof) to identify effective and efficient startup equipment and procedures for the field or well production system(s). While the present disclosure and figures discuss some embodiments of the integrated workflow in terms of subsea hydrocarbon production systems, it should be understood that the integrated workflow may apply to any suitable application related to any fluid production or injection system, such as other offshore production or injection applications, as well as onshore or surface production or injection applications. An injection system may include any suitable injection system, such as a chemical injection system, a water injection system, a steam injection system, and the like. Additional details with regard to the integrated workflow will be discussed below with reference to FIGS. 1-9.

By way of introduction, FIG. 1 is a block diagram of an example computer system 10 that may generate and/or implement an integrated workflow 12, in accordance with embodiments of the present disclosure. The computer system 10 may be any suitable computing device, such as a desktop computer, a personal computer, a laptop device, a tablet, a mobile device, and the like. As illustrated, the computer system 10 includes a processor(s) 14 (e.g., a microprocessor(s)) that may execute software programs or computer-executable instructions to generate and/or implement the integrated workflow 12. Moreover, the processor 14 may include multiple microprocessors, one or more "general-purpose" microprocessors, one or more special-purpose microprocessors, and/or one or more application specific integrated circuits (ASICs), or some combination thereof. For example, the processor 14 may include one or more reduced instruction set computer (RISC) processors.

The computer system 10 may include a memory device(s) 16 that may store information such as control software, look up tables, configuration data, etc. In particular, the memory device 16 may store the integrated workflow 12, as well as any relevant or associated data structures, objects, and the like, such as reservoir models, network models, integrated models, etc. The memory device(s) 16 may include a tangible, non-transitory, machine-readable medium, such as a volatile memory (e.g., a random access memory (RAM)) and/or a nonvolatile memory (e.g., a read-only memory (ROM), a flash memory, a hard drive, or any other suitable optical, magnetic, or solid-state storage medium, or a combination thereof). The memory device(s) 16 may store a variety of information and may be used for various purposes. For example, the memory device(s) 16 may store machine-readable and/or processor-executable instructions (e.g., firmware or software) for the processor 14 to execute, such as instructions for generating and/or implementing the integrated workflow 12.

In some embodiments, the memory device(s) 16 may store software used to generate integrated asset models, such as the Schlumberger Integrated Asset Model (IAM) software, the Petroleum Experts (Petex) Integrated Production Modeling (IPM) software, or any other suitable integrated modeling software.

In addition, the computer system 10 may be communicatively coupled to one or more sensor(s) 18. The sensor(s) 18 may include any suitable sensor for detecting or measuring a property related to fluid production and/or injection, such as a pressure sensor, a temperature sensor, a fluid flow rate sensor, a composition sensor, a particulate sensor, a vibration sensor, a load sensor, a fluid flow regime sensor, a fluid holdup sensor, and the like, or any combination thereof. In certain embodiments, the sensor(s) 18 may be may be mechanical, electronic (wired or wireless), or optical. In certain embodiments, the sensor(s) 18 may be remotely disposed at the field, such as within a well or network of wells, to provide real time data regarding properties related to the production of extracted hydrocarbons and other fluid(s) or material(s).

The computer system 10 may also be communicatively coupled to one or more components of a fluid production and/or injection system 20 (such as a subsea hydrocarbon production system). The fluid production and/or injection system 20 may be any suitable fluid production and/or injection system (e.g., a surface (non-offshore) fluid injection system). While sensor(s) 18 may provide real-time data regarding the operational state or process conditions of the fluid production and/or injection system 20, valves, rotating process equipment, and the like may have control elements to effect change to aspect(s) of the operational state or to one or more process conditions. For example, trees, manifolds, spools, pumps and the like may contain controllable valves and/or chokes which can be controlled for valve and choke opening setting and pump motor adjustments by the computer system 10.

Components of the fluid production and/or injection system 20 may transport hydrocarbons from a reservoir up to a delivery point (e.g., if a subsea system, to a delivery point on or near the water surface or onshore earth surface). The fluid production and/or injection system 20 may range in complexity from, for example, a satellite well 22 with a flowline linked to a platform, to multiple wells coupled to manifolds (e.g., a network 24 of wells 22), which transport hydrocarbons to a fixed or floating facility or an onshore installation (not shown). The computer system 10 may send instructions to the fluid production and/or injection system 20, such as instructions to shut down the fluid production and/or injection system 20, startup the fluid production and/or injection system 20, reroute production, increase or choke back production flow, and the like.

The methods illustrated in FIGS. 2-9 illustrate processes employed by the integrated workflow 12. While the methods and accompanying descriptions describe the steps in certain sequences, it should be understood that the steps may be performed in different orders, and some steps may not be performed or may be skipped altogether.

Figure 2:
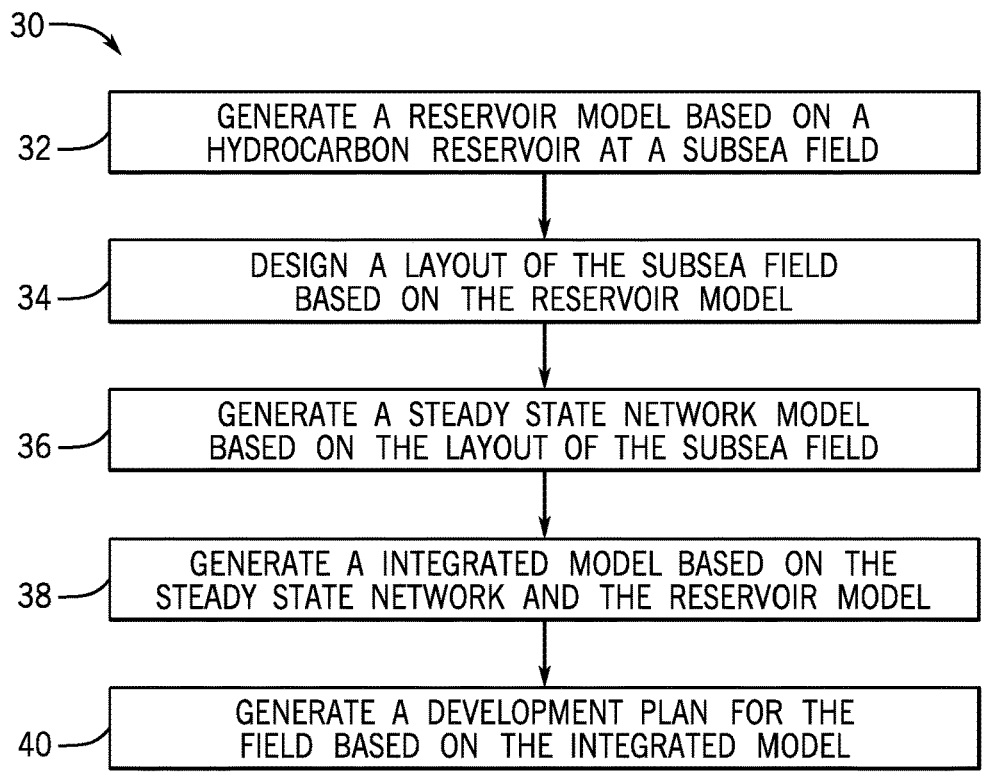
FIG. 2 is a flowchart of a method for generating a steady state field design, in accordance with one or more embodiments of the present disclosure.

FIG. 2 is a flowchart of a method 30 for generating a steady state field design, in accordance with an embodiment of the present disclosure. The steady state field design may enable evaluation of the field at certain times (e.g., snapshots in time). The computer system 10 may generate (block 32) a reservoir model based on a hydrocarbon reservoir at a field (e.g., a subsea field). For example, the reservoir model may be based at least in part on fluid properties and reservoir characteristics of the reservoir. The fluid properties may include, for example, gas content, oil content, water content, hydrocarbon composition, fluid viscosity, temperature, pressure, particulate matter (solids content), and the like. The reservoir characteristics may include, for example, size, strength, permeability, porosity, oil-water contacts, gas-oil contacts, facies heterogeneity, transmissivity at faults, and the like. In some embodiments, the fluid properties and reservoir characteristics are provided by the sensor(s) 18 communicatively coupled to the computer system 10. The reservoir model may output a bottom hole location(s) (representing the "bottom" of the well or where the inflow of fluids occurs from the reservoir, such as perforations located above the bottom of the well or multi-zone performations) and a set of corresponding predicted bottom hole pressure(s) over the remaining life of the field. The bottom hole location may be expressed in any suitable format, such as longitude and latitude coordinates, Cartesian (x, y, and z) coordinates, and the like. The reservoir model may also output a production forecast(s) that includes water, oil, and/or gas flowrates over the remaining life of the field.

The computer system 10 may then design (block 34) a layout of the field based on the reservoir model predictions. For example, the layout may be based at least in part on the bottom hole location(s) and/or the production forecast(s) output by the reservoir model. The field layout may provide a drill center location(s), which may be determined based on increasing production and/or decreasing cost of materials (e.g., pipe and equipment) used to transfer hydrocarbons from a well(s) to one or more processing facilities (e.g., a fixed or floating facility or an onshore installation). The field layout may also provide a number of pipes or "tie-backs" used to transfer the hydrocarbons from the well(s) to the one or more facilities. The field layout enables determination (e.g., by an engineer and/or the computer system 10) of well geometries, profiles of the tie-backs, profiles of risers, and the like. Profile in this case refers to a property correlated to coordinates based on one or more reference point(s) along the length of a structure, for example a pipe for the well, tie-backs, risers, or any other fluid conduit. For example, if a pipeline is deployed along the seafloor to transfer hydrocarbon fluids from a well head to a pumping unit positioned a few kilometers away, bathymetry (seafloor topography) information and latitude and longitude coordinates can be used to determine the location of equipment. Moving from the well head at set distances, the bathymetry information for a location may be used to provide the depth of the pipe at that distance. Continuing towards the pumping unit, a profile of depth versus distance along the pipe is created. For wells and risers, typically Cartesian (x, y, and z) or other orthogonal coordinates are provided along the well tubing or the riser to create the profiles. Connection of all of the created profiles provide a three-dimensional (3D) layout for a fluid production and/or injection network.

The computer system 10 may generate (block 36) a representative steady state network model based on the designed field layout (block 34). For example, the steady state network model may be generated (block 36) based at least in part on the drill center location(s), the number of tie-backs, the well geometries, the profiles of the tie-backs, the profiles of risers, and the like. The steady state network model may model single well, multiple wells, a network of wells, one or more processing facilities, production equipment, and/or any other components that transfer hydrocarbons extracted from the reservoir to the one or more processing facilities. The steady state network model may include input parameters for a number of wells, a size of the well(s) (e.g., overall or producing length, inner or outer diameter(s), and the like), relevant distances (e.g. between wells and/or other equipment, such as pumps or other boosting equipment, the surface, and the like), information related to artificial lift (e.g., any system that adds energy to a fluid column in a wellbore to initiate and/or improve production from the well), pipeline sizing information, information related to production routing (e.g., a system or process used to divert well production to reduce or minimize back pressures within a network), information related to commingling production from multiple wells, information related to an injection system, and the like. In some embodiments, a network model may be selected based on any combination of existing assets, well and/or asset availability, scheduling preferences, and the like. The network model may include a variety of equipment selected (e.g., by a user, simulator, software, and the like) based on estimated characteristics of the hydrocarbon formation. For example, the equipment may be selected to operate under a desired pressure that is estimated based on data associated with the hydrocarbon formation. The network model may be provided using software such as, for example and without limitation, the Schlumberger PIPESIM software or the Petroleum Experts (Petex) GAP software, or any other suitable network model producing software. In some embodiments, multiple network models may be used if, for example, it is desirable to evaluate a variety of network configurations. The steady state network model may include a transient portion that models startup of the fluid production and/or injection system 20.

The computer system 10 may then generate (block 38) an integrated model based on the steady state network model (see blocks 36, 34) and the reservoir model (block 32). The integrated model may be generated (block 38) by coupling the steady state network model and the reservoir model. The integrated model may use expected behavior of hydrocarbons being extracted from the reservoir to determine how the extracted hydrocarbons may be distributed via network routes according to the network model. In some embodiments, the computer system 10 may generate multiple reservoir models as scenarios of one base reservoir model, where each of the multiple reservoir models may have different sets of input variables, boundary conditions, and/or initial conditions using a same grid (e.g., field). In some embodiments, the grid may include a matrix of grid blocks (or other discretized shapes) applied in simulation based on hydrocarbon formation data/reservoir characteristics to manipulate a numerical solution during processing. The computer system 10 may couple the reservoir base model to the steady state network model by mapping reservoir completions to network wells in the integrated modeling framework to exchange boundary conditions. Production controls/field development strategies may be defined in the integrated model to manage a full field model. In some embodiments of the present disclosure, the integrated model may be generated at least in part using commercially available simulation software such as the Schlumberger Integrated Asset Model (IAM) software, the Petroleum Experts (Petex) Integrated Production Modeling (IPM) software, or any other suitable integrated modeling software.

The computer system 10 may then generate (block 40) a development plan for the field based on the integrated model (block 38). Based on the information provided by the integrated model, the field development plan (block 40) may include sizes of the tie-back lines, the risers, and separator, as well as a drilling/production strategy that may efficiently deplete the reservoir and increase hydrocarbon production. In embodiments, the generated field development plans may include one or more of a variety of equipment, activities, and/or processes used to develop a field, for example and without limitation, equipment, activities, and/or processes relating to environmental impact, geophysics, geology, reservoir engineering, production engineering, infrastructure, well design and construction, completion design, surface facilities, and economics and risk assessment. In some embodiments, to generate the field development plan, the computer system 10 may compare and/or evaluate designs in various stages and optimize selection to deliver increased return and/or recovery. For example, the computer system 10 may compare and/or evaluate conceptual designs (e.g., simple material balances with general fluid flow), detailed designs (e.g., that include sizing and/or rating of equipment used to produce and/or inject fluids over the life of the field), or designs that are in a design stage between conceptual and detailed designs.

Figure 3:
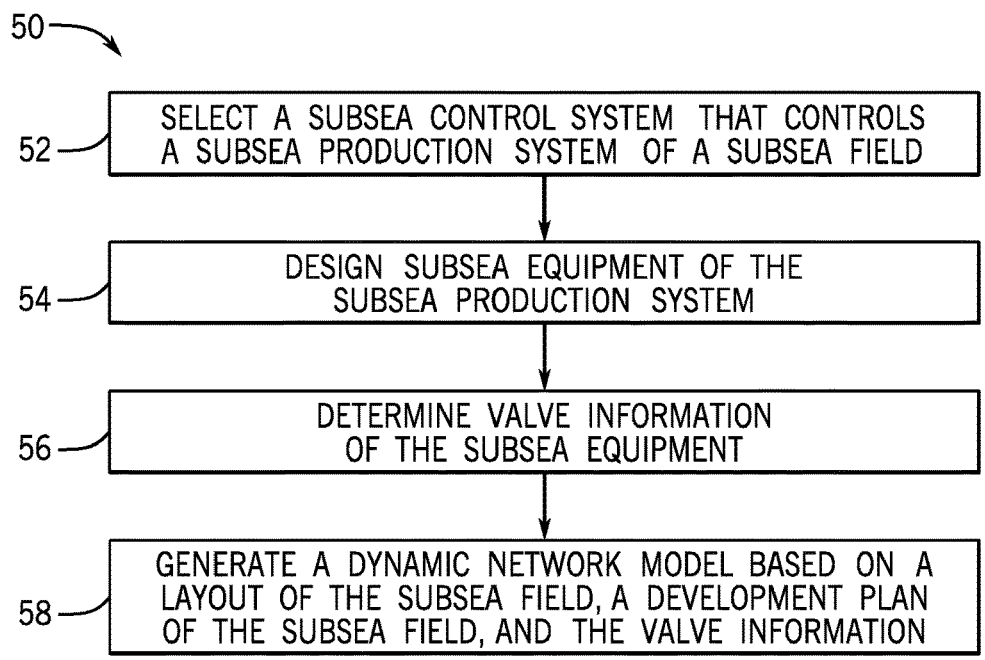
FIG. 3 is a flowchart of a method for incorporating relevant fluid production and/or injection equipment to the integrated workflow, in accordance with one or more embodiments of the present disclosure.

FIG. 3 is a flowchart of a method 50 for incorporating relevant fluid production and/or injection equipment into the integrated workflow 12, in accordance with one or more embodiments of the present disclosure. The relevant subsea equipment, which is discussed in more detail below, may affect startup time of the fluid production and/or injection system 20. The computer system 10 may select (block 52) a subsea control system (e.g., electric, hydraulic, and/or mechanical, individually (e.g. all-electric) or in any hybrid combination thereof) that controls components of the fluid production and/or injection system 20. The subsea control system may also affect startup time of the fluid production and/or injection system 20, due to operation times of the subsea control system, specifications of the subsea control system, communication times between components of the subsea control system, delay times between receiving a signal at a component of the subsea control system and performing an action associated with the signal by the component, and the like. As such, the computer system 10 may use the integrated workflow 12 to evaluate multiple subsea control systems along with various control strategies and select one or more subsea control systems and strategies that effectively and efficiently startup the subsea production system 10 as compared to the other subsea control systems.

The computer system 10 may then design (block 54) the relevant subsea equipment and equipment characteristics (e.g., sizes, quantities, and the like) of the fluid production and/or injection system 20. In some embodiments, the computer system 10 may design the relevant subsea equipment and equipment characteristics based on the selected one or more subsea control systems. The relevant equipment may include, for example, a tree system(s) (e.g., vertical, horizontal, hybrid, modular, and/or other tree system(s) used to control a flow of hydrocarbons from a well to one or more facilities via a control valve(s) and/or a choke(s)), a manifold(s), a pipeline end manifold(s) (PLEM), a pipeline end termination(s) (PLET), a jumper(s) (used to connect a manifold system to a well, a sled to a well, a manifold to a sled, and/or the like), an umbilical cable(s), one or more umbilical termination assemblies, a subsea distribution unit(s), a communication distribution unit(s), a hydraulic flying lead(s), an electrical flying lead(s), and the like. The equipment characteristics may include sizes and/or quantities of the equipment, available power in the fluid production and/or injection system 20 (e.g. at each drill center), time to charge components of the fluid production and/or injection system 20, and the like.

The computer system 10 may also determine (block 56) valve information (e.g., sizes and stroke times) of the subsea equipment. In some embodiments, the valve information may be determined for each valve component of the fluid production and/or injection system 20. Determining frequency of opening valves and time between opening of subsequent valves of the fluid production and/or injection system 20 may be based at least in part on the available power and/or the time to charge, and may affect overall startup time of the fluid production and/or injection system 20.

The computer system 10 may then generate (block 58) a dynamic network model based on the field layout design, the field development plan, and the valve information. In embodiments, the field layout design may be the layout designed in block 34 of FIG. 2, and the field development plan may be the development plan generated in block 40 of FIG. 2. The dynamic network model may provide a transient evaluation of the network over time (e.g., showing values of the network changing over time). For example, the computer system 10 may determine an effective and efficient opening sequence for each valve based at least in part on the available power at each drill center provided by the field layout design, the field development plan, and the valve information. The dynamic network model may include and illustrate information associated with each valve of the fluid production and/or injection system 20 changing over time, such as opening and/or closing timings and controls used to startup a well of the field.

Figure 4:
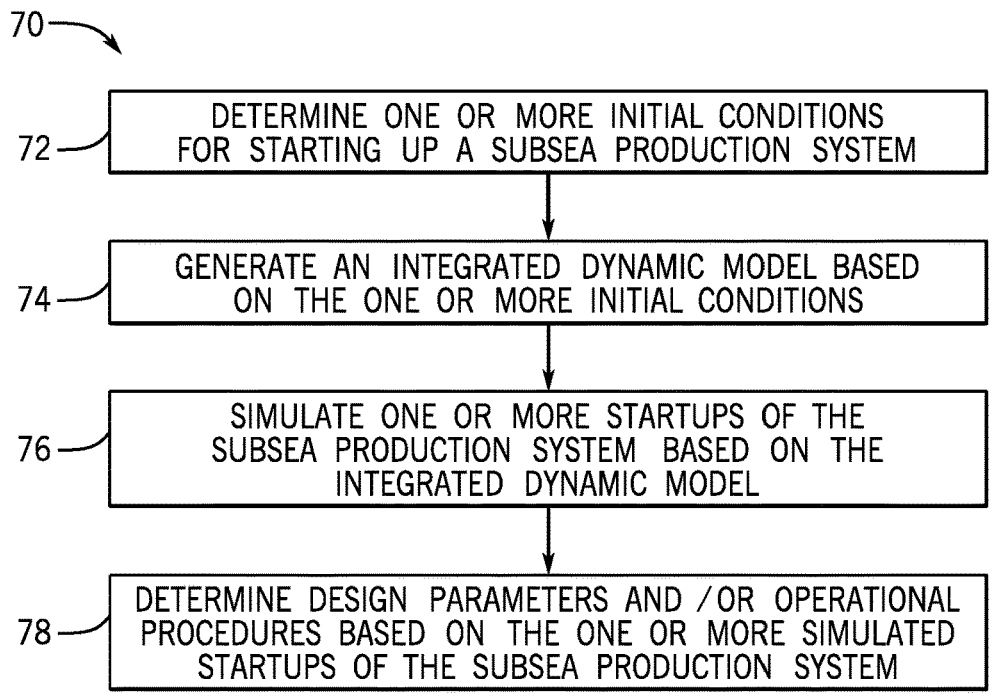
FIG. 4 is a flowchart of a method for evaluating startup of a field that is in its early life, in accordance with one or more embodiments of the present disclosure.

FIG. 4 is a flowchart of a method 70 for evaluating startup of a field that is in its early life, in accordance with one or more embodiments of the present disclosure. The computer system 10 may determine (block 72) initial condition(s) for starting up the fluid production and/or injection system 20 that is in its early life. For example, the initial condition(s) may be based on whether a shutdown of the fluid production and/or injection system 20 is planned or unplanned. The initial condition(s) may also include a state of the field (e.g., a production network of wells) at the time of the startup. The initial condition(s) may include, for example, a pressure(s), a production rate(s), a phase ratio(s), or any combination thereof, of the reservoir model. The initial condition(s) may also include, for example, a delivery pressure, a total flow rate, or any combination thereof, of the dynamic network model.

The computer system 10 may generate (block 74) an integrated dynamic model based at least in part on the initial condition(s). The integrated dynamic model may evaluate the field over time (e.g., showing characteristics and/or values, such as timings, equipment condition, hydrocarbon delivery time, and the like, of the field changing over time).

The integrated dynamic model (block 74) may also be generated based at least in part on the dynamic network model (see, e.g., FIG. 3, block 58) and/or the reservoir model (see, e.g., FIG. 2, block 32). In particular, the integrated dynamic model may couple wells of the production network to completions (e.g., completing a well in the fluid production and/or injection system 20 after drilling) in the reservoir model. For example, the integrated dynamic model may couple the wells to completions by constraining a pressure of a completion of the reservoir model to a multiphase transient simulator's well, or bottom hole, pressure. The integrated dynamic model may also constrain an inflow of the multiphase transient simulator to a production rate(s) and/or a phase ratio(s) predicted by the reservoir model.

In embodiments, the integrated dynamic model (block 74) may couple an end point (e.g., a top of a riser) of the dynamic network model (see, e.g., FIG. 3, block 58) to an input (e.g., a separator) of a process model (e.g., of the separator). For example, the integrated dynamic model may couple the end point to the input by constraining a delivery pressure of the dynamic network model to a separator pressure of the process model. The integrated dynamic model may also constrain an inflow input of the process model to a total flow rate predicted by the dynamic network model.

The computer system 10 may then simulate (block 76) one or more startups of the fluid production and/or injection system 20 based on the integrated dynamic model (block 74). Each of the one or more startups (block 76) may include varying characteristics and/or values associated with the field, such as different pressures, temperatures, flow rates, amounts of hydrocarbon production, and the like. The computer system 10 may determine (block 78) design parameters and/or operational procedures based on the one or more simulated startups of the fluid production and/or injection system 20. In some instances, multiple startup simulations may determine effective or efficient design parameters and/or operational procedures. The design parameters and/or operational procedures may include a startup sequence(s) for a well(s) and/or a drill center(s), an amount of chemical injection used to mitigate hydrate formation, and/or a flow rate(s) per well, accumulation of a water, oil, or condensate in a pipeline(s) ("slugging"), a size of slug catcher, and the like, or any combination thereof. In some embodiments, the computer system 10 may evaluate another fluid production and/or injection control system by repeating the methods of FIGS. 3 and 4. The computer system 10 may additionally select a better performing or optimum control system by comparing the evaluations.

Figure 5:
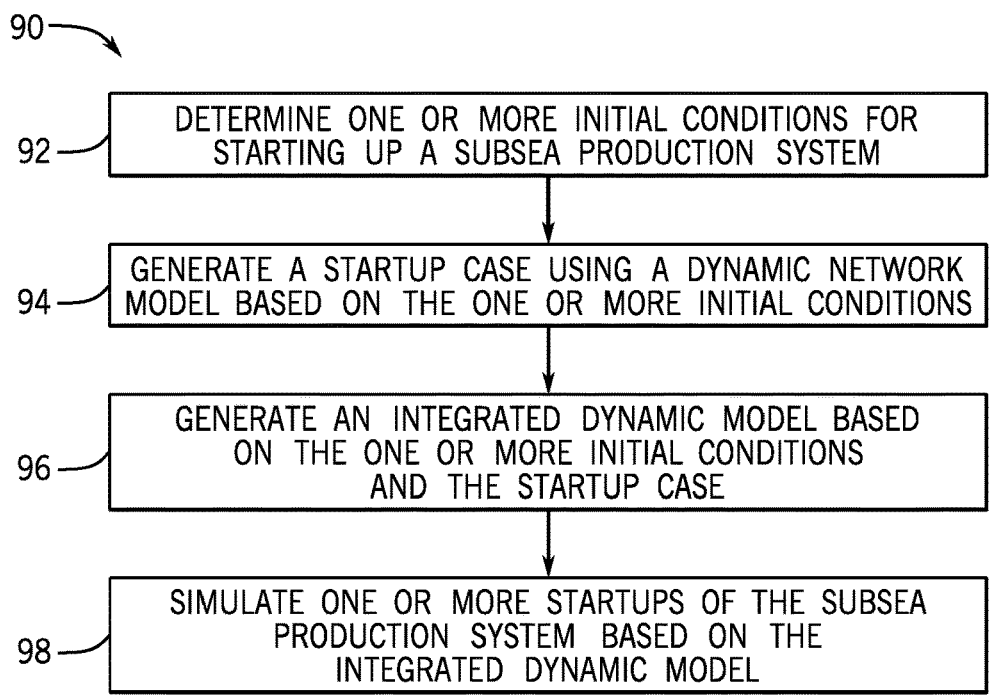
FIG. 5 is a flowchart of a method for evaluating startup of a field that is in its middle or late life, in accordance with one or more embodiments of the present disclosure.

The same control system may be evaluated at a different time(s) throughout the life of the field, as illustrated in FIG. 5. FIG. 5 is a flowchart of a method 90 for evaluating a startup of a field that is in its middle or late life, in accordance with one or more embodiments of the present disclosure. The computer system 10 may determine (block 92) initial condition(s) for starting up the fluid production and/or injection system 20 that is in its middle or late life after the fluid production and/or injection system 20 has been shut down. The initial condition(s) may be determined based on the integrated model (see, e.g., FIG. 2, block 38). For example, the integrated model may be stepped through to a desired time (e.g., 5, 10, 15, 30 years, or any number of days, months, or years) to prepare for a startup simulation. By stepping through the integrated model, a startup case for the fluid production and/or injection system 20 may be generated at the desired time representing the initial condition(s) for the startup simulation. The initial condition(s) may include, for example, one or more productivity indices (PIs) (e.g., a mathematical means of expressing an ability of a reservoir to deliver fluids to a wellbore), or a pressure(s), of the reservoir model.

The computer system 10 may generate (block 94) a startup case using a dynamic network model based on the initial condition(s) (e.g., the one or more productivity indices (PIs), the pressure(s), or any combination thereof). The dynamic network model may be generated as shown in block 58 of FIG. 3.

The computer system 10 may generate (block 96) an integrated dynamic model based on the initial condition(s), the startup case, or any combination thereof. For example, the integrated dynamic model may be generated based on simulating a shutdown or a state of the field at the time of startup that uses the initial condition(s) and the startup case. As discussed above, the integrated dynamic model may also be generated based on a dynamic network model (see, e.g., FIG. 3, block 38) and/or a reservoir model (see, e.g., FIG. 2, block 32). In particular, the integrated dynamic model may couple wells of the production network to completions (e.g., completing a well in the fluid production and/or injection system 20 after drilling) in the reservoir model.

The computer system 10 may then simulate (block 98) one or more startups of the fluid production and/or injection system 20 based on the integrated dynamic model (block 96). In some instances, multiple startup simulation simulations may be performed (block 98) to determine effective or efficient design parameters and/or operational procedures of the field at later life. In some embodiments, upon determining the operational procedures, the computer system 10 may automatically adjust the current operational procedure(s) at appropriate times during the life of the field.

Figure 6:
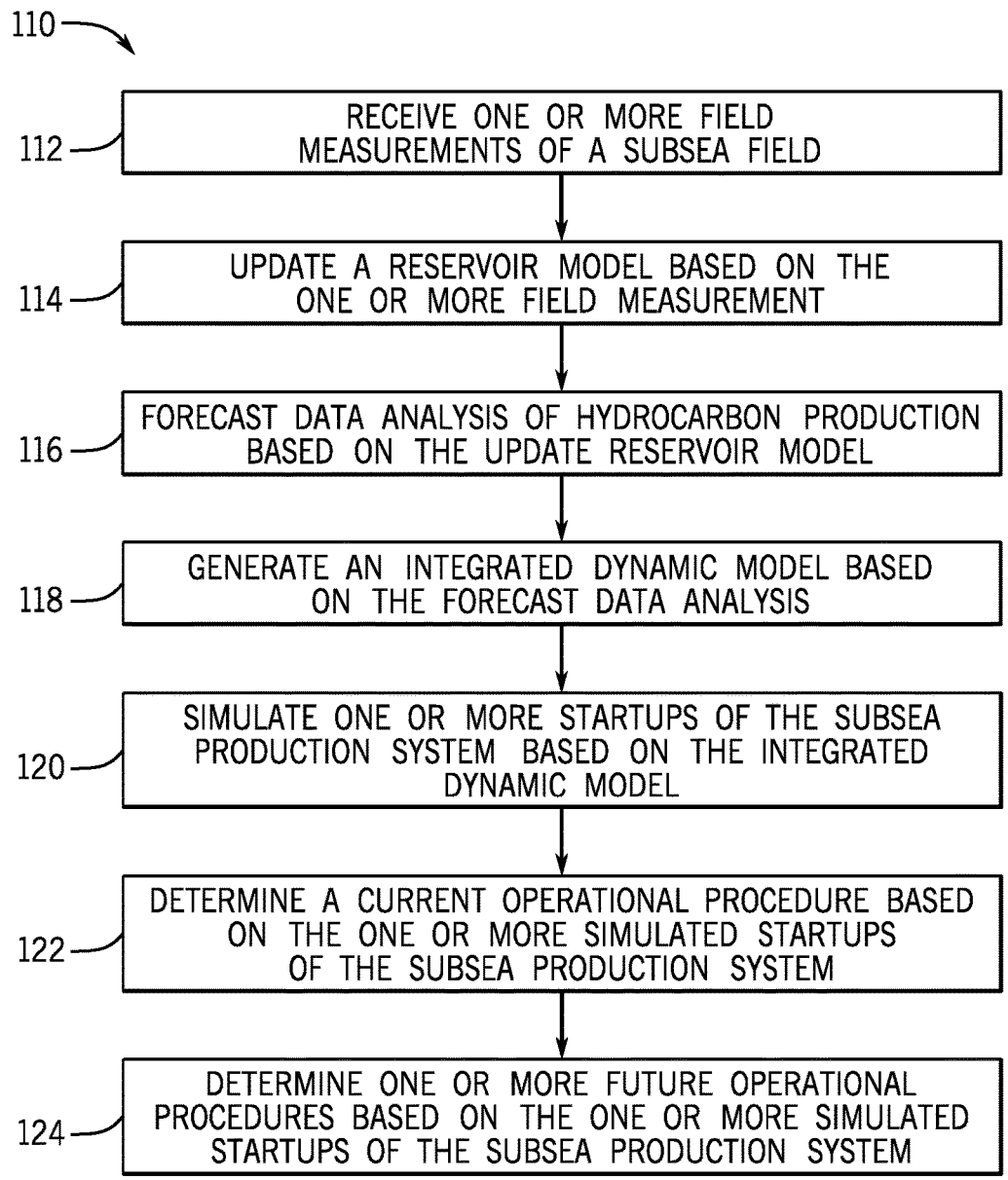
FIG. 6 is a flowchart of a method for updating models of the integrated workflow using new information, in accordance with one or more embodiments of the present disclosure.

FIG. 6 is a flowchart of a method 110 for updating models of the integrated workflow 12 using new information, in accordance with one or more embodiments of the present disclosure. For example, during hydrocarbon production, new information may become available. The new information may be related to a pressure(s), a temperature(s), a flow(s), and the like, at certain location(s) at the field. The new information may be acquired, for example, by the sensor(s) 18. The computer system 10 may update models (e.g., the reservoir model, the steady state network model, and the like) of the integrated workflow 12 by incorporating the new information. In this manner, the models may overcome incorrect or inaccurate assumptions made during initial data-gathering processes (e.g., generating the reservoir model, designing the field layout, and the like) and produce updated and more accurate models based on history match with more confidence for forecasted results.

The computer system 10 may receive (block 112) measurement(s) of the field. For example, the sensor(s) 18 may provide the field measurement(s), such as hydrocarbon production information from the wells. The field measurement(s) may include a flowrate(s), a pressure(s), and the like, at the field. In some cases, the field measurement(s) may be at one or more wells of the field.

The computer system 10 may update (block 114) the reservoir model (see, e.g., FIG. 2, block 32) based on the field measurement(s). For example, the computer system 10 may perform a history match of the field measurement(s) with parameters used to generate the reservoir model using offline system identification methods. If one or more field measurement(s) do not match based on the history of the parameters used to generate or previously update the reservoir model, the computer system 10 may update non-matching parameters of the reservoir model based on the field measurement(s).

The computer system 10 may forecast (block 116) data analysis of hydrocarbon production based on the updated reservoir model (block 114). The forecasted data analysis (block 116) may include different types of data, such as water, oil, and/or gas flowrate(s), water cut, gas oil ratio, and the like. The forecasted data analysis may be divided into periods of similar hydrocarbon production based on, for example, the type of data. In some embodiments, the types of data may be selected (e.g., by default) by the computer system 10.

The computer system 10 may then generate (block 118) an integrated dynamic model based on the forecasted data analysis (block 116). The computer system 10 may then simulate (block 120) one or more startups of the fluid production and/or injection system 20 based on the integrated dynamic model (block 118). In some instances, multiple startup simulations may be run to determine effective or efficient design parameters and/or operational procedures.

The computer system 10 may determine (block 122) a current operational procedure based on the one or more simulated startups of the fluid production and/or injection system 20 with a time range of validity or efficacy based on production parameters. The computer system 10 may also determine (block 124) a future operational procedure(s) based on the one or more simulated startups of the fluid production and/or injection system 20 for subsequent periods with respective validity time ranges. The method 110 shown in FIG. 6 may be repeated periodically (e.g., monthly, quarterly, and the like) to update operational procedures based on changes in the field that may not have been accounted for during initial design of models of the integrated workflow 12.

Figure 7:
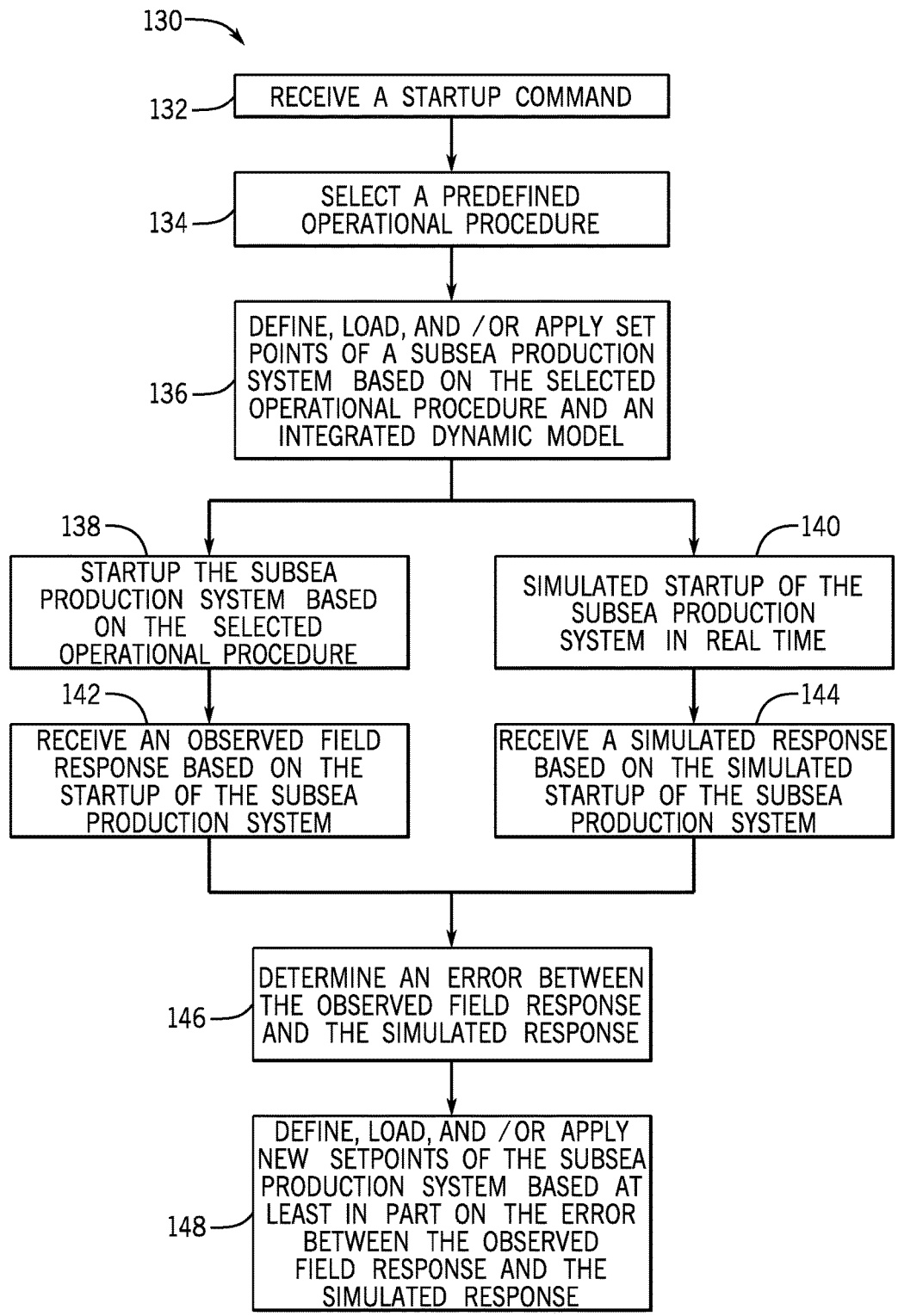
FIG. 7 is a flowchart of a method for automating startup of the field, in accordance with one or more embodiments of the present disclosure.

FIG. 7 is a flowchart of a method 130 for automating startup of a field, in accordance with one or more embodiments of the present disclosure. The computer system 10 may receive (block 132) a startup command. The computer system 10 may select (block 134) a predefined operational procedure from a previously created library of operational procedures based on certain field conditions (e.g., temperature(s), pressure(s), time after shutdown, and the like). The computer system 10 may define, load, and/or apply (block 136) set points (e.g., desired or target values) of a live fluid production and/or injection system 20 or control element thereof based on the selected operational procedure and the integrated dynamic model (see, e.g., FIG. 2 block 38). For example, as part of a selected predefined operational procedure, an instruction may call for a valve in a well head tree to be opened to 50% of full opening. The computer system 10 would apply this set point instruction to a controller for that valve, and the actuator for the valve would be activated, opening or closing the valve from its current setting to 50% of full opening. Set points may relate to one or more of a variety of operational parameters and/or components, including, for example, pump speed, flow rate setting on a pipeline, well head pressure limits, and the like.

The computer system 10 may startup (block 138) the fluid production and/or injection system 20 based on the selected operational procedure (block 136). To effect such startup (block 138), the computer system 10 may send commands to components of the fluid production and/or injection system 20 to startup the fluid production and/or injection system 20. The computer system 10 may also simulate (block 140) a startup of the fluid production and/or injection system 20 in real time. For example, the computer system 10 may orchestrate the startup of the fluid production and/or injection system 20 in a closed loop control by (i) using the integrated dynamic model (see, e.g. FIG. 4, block 74 or FIG. 5, block 96) to generate a simulated output, (ii) comparing the integrated dynamic model output constantly or intermittently to the real state of fluid production and/or injection system 20, and (iii) dynamically adjusting the operational commands to the fluid production and/or injection system 20 accordingly. In other words, and as described further in the paragraphs below, the computer system 10 simulates the operational procedure, events from the simulation trigger actions on the control elements on the actual fluid production and/or injection system 20, and the computer system 10 monitors and responds in simulation to real time conditions of the system.

After starting up the fluid production and/or injection system 20, the computer system 10 may receive (block 142) an observed field response from the fluid production and/or injection system 20. After simulating the startup of the fluid production and/or injection system 20, the computer system 10 may receive (block 144) a simulated response. For example, the simulated response may be based on an output of the integrated dynamic model.

The computer system 10 may then determine (block 146) a discrepancy, variance, difference, or error between the observed field response and the corresponding simulated response. The computer system 10 may modify and/or update models (e.g., the integrated dynamic model) of the integrated workflow 12 to match the observed field response and account for the error. For example, such updates to online models may be used to account for measurement reconciliation, fouling in equipment and measurement, and the like. In embodiments, the computer system 10 may modify the integrated dynamic model to account for the error using the integrated dynamic model running in a look-ahead mode. The computer system 10 may define, load, and/or apply (block 148) new set points of the live fluid production and/or injection system 20 based at least in part on removal of the error between the observed field response and the simulated response.

Figure 8:
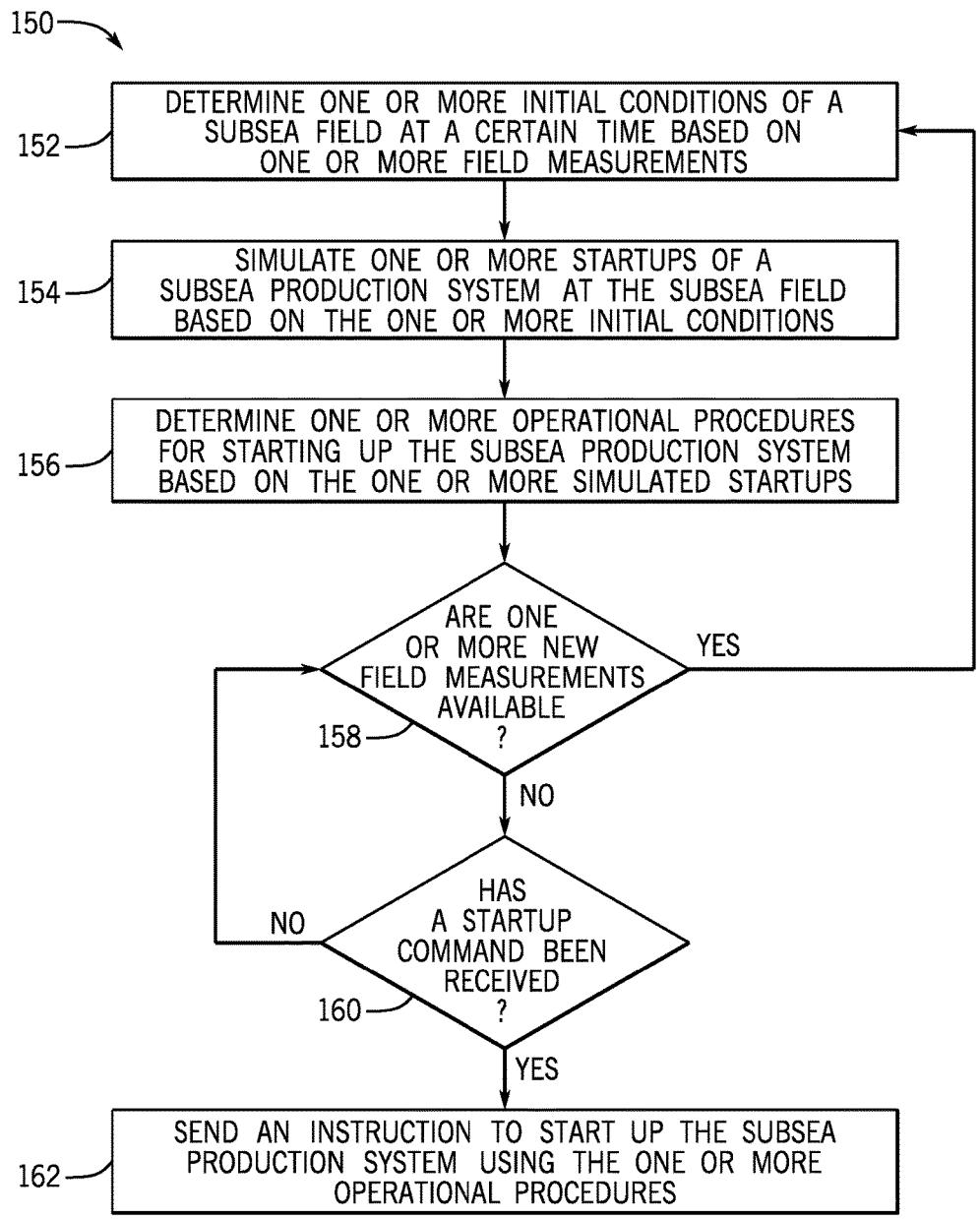
FIG. 8 is a flowchart of a method for starting up the fluid production and/or injection system, in accordance with one or more embodiments of the present disclosure.

FIG. 8 is a flowchart of a method 150 for starting the fluid production and/or injection system 20, in accordance with one or more embodiments of the present disclosure. The computer system 10 may determine (block 152) initial condition(s) of a field at a certain time based on field measurement(s). The initial condition(s) may be determined based on an integrated model (see, e.g., FIG. 2, block 38). For example, the integrated model may be stepped through to a certain time. The initial condition(s) may include, for example, a PI(s), a pressure(s), temperature(s), flow rate(s), and the like, in the reservoir model (see, e.g., FIG. 2 block 32). In some embodiments, the sensor(s) 18 may provide the field measurement(s), such as hydrocarbon production information from the wells. The field measurement(s) may include a flowrate(s), a pressure(s), and the like. The field measurement(s) may be input to the reservoir model (see, e.g., FIG. 2 block 32).

In some embodiments, the computer system 10 may generate an integrated dynamic model (see, e.g. FIG. 4, block 74 or FIG. 5, block 96) based at least in part on the initial condition(s). The integrated dynamic model may enable evaluation of the field over time (e.g., showing values of the field changing over time). For example, the integrated dynamic model may be generated based on simulating a shutdown or a state of the field at the time of startup that uses the initial condition(s).

The computer system 10 may simulate (block 154) one or more startups of a fluid production and/or injection system 20 at the field based at least in part on the initial condition(s). The computer system 10 may determine (block 156) one or more operational procedures for starting up the fluid production and/or injection system 20 based on the one or more simulated startups. That is, the computer system 10 may perform one or more dynamic startup simulations based on the integrated dynamic model to determine effective or efficient operational procedures. The operational procedures may include a startup sequence(s) for a well(s) and/or a drill center(s), an amount of chemical injection used to mitigate hydrate formation, and/or a flow rate(s) per well, accumulation of a water, oil, or condensate in a pipeline(s) ("slugging"), a size of slug catcher, and the like.

The computer system 10 may then determine (block 158) whether there is a new field measurement(s) available. If so, the computer system 10 may repeat blocks 152, 154, and 156 based on the new field measurement(s). In some embodiments, determining whether there is a new field measurement(s) available may occur on a periodic basis (e.g., monthly, quarterly, and the like) to update the operational procedures based on changes in the field that may not have been accounted for earlier. If the computer system 10 determines that a new field measurement(s) is not available, the computer system 10 determines (block 160) whether a startup command has been received. The startup command may be sent from the computer system 10, another computer system, or the like. If the computer system 10 has not received the startup command, the computer system 10 may return to the procedure of block 158 to determine whether a new field measurement(s) is available to update the operational procedures.

If the computer system 10 has received the startup command, the computer system 10 may startup (block 162) the fluid production and/or injection system 20 (or send one or more instructions to startup the fluid production and/or injection system 20) using the one or more operational procedures. By performing the method 150, the computer system 10 may dynamically model effects of operational procedures during the startup of the fluid production and/or injection system 20 at different times throughout the life of the field and update the operational procedures to account for changes in the field that may not have been accounted for earlier. In this manner, the method 150 may enable the computer system 10 to identify potential inefficiencies that may occur during startup and provide mitigation and/or operational procedures to be performed based on changing reservoir productivity and/or constraints imposed by a facility (e.g., a fixed or floating facility or an onshore installation) or a well or network.

Figure 9:
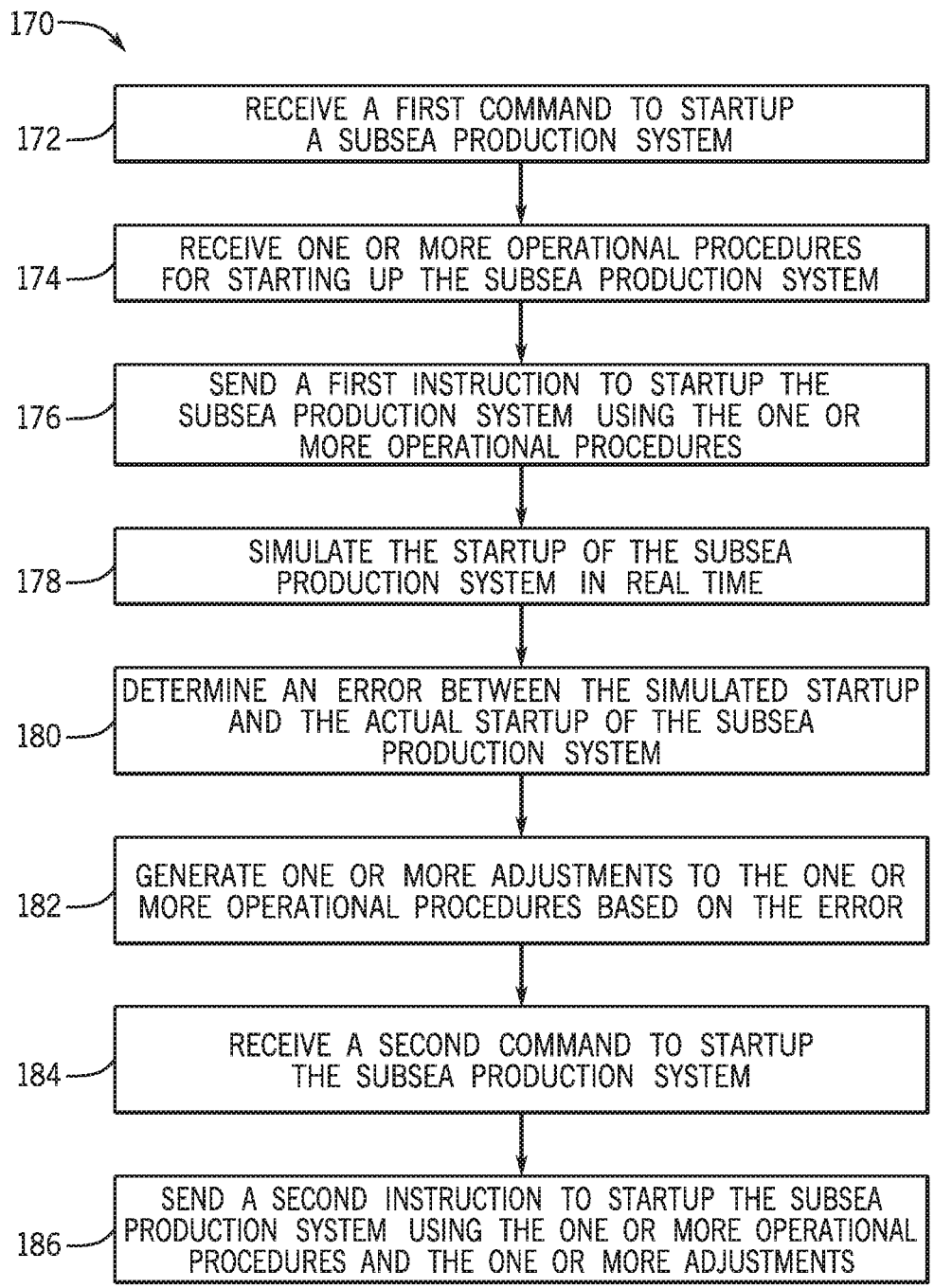
FIG. 9 is a flowchart of a method for adjusting startup of the fluid production and/or injection system, in accordance with one or more embodiments of the present disclosure.

FIG. 9 is a flowchart of a method 170 for adjusting startup of the fluid production and/or injection system 20, in accordance with one or more embodiments of the present disclosure. The computer system 10 may receive (block 172) a first command to startup a fluid production and/or injection system 20. The startup command may be sent from the computer system 10, another computer system, and the like. The computer system 10 may also receive (block 174) one or more operational procedures for starting up the fluid production and/or injection system 20. For example, the one or more operational procedures may be determined based on the method 150 of FIG. 8.

The computer system 10 may then startup (block 176) the fluid production and/or injection system 20 (or send one or more instructions to startup the fluid production and/or injection system 20) using the one or more operational procedures. The computer system 10 may also simulate (block 178) the startup of the fluid production and/or injection system 20 in real time. In some embodiments, the computer system 10 may simulate the startup of the fluid production and/or injection system 20 simultaneously or at approximately the same time as the actual startup of the fluid production and/or injection system 20. For example, the computer system 10 may use commercially available simulation software such as the Schlumberger Integrated Asset Model (IAM) software, the Petroleum Experts (Petex) Integrated Production Modeling (IPM) software, or any other suitable integrated modeling software, to simulate the startup of the fluid production and/or injection system 20.

The computer system 10 may determine (block 180) an error or difference between a condition, characteristic, or response of the simulated startup and the actual startup of the fluid production and/or injection system 20. In some embodiments, the computer system 10 may compare an observed field response based on the actual startup of the fluid production and/or injection system 20 and a simulated response to determine the error.

The computer system 10 may generate (block 182) one or more adjustments to the one or more operational procedures based on the error. In some embodiments, the computer system 10 may identify deviations or adjustments to the integrated dynamic model (see, e.g. FIG. 4, block 74 or FIG. 5, block 96) by comparing the simulated startup (e.g., block 178) of the fluid production and/or injection system 20 and an actual startup of the fluid production and/or injection system 20 that is a result of the first set of instructions (e.g., block 176). For example, the computer system 10 may modify one or more models (e.g., the integrated dynamic model) to match the model with an observed field response of the actual startup of the fluid production and/or injection system 20 and account for the error.

The computer system 10 may then receive (block 184) a second command to startup the fluid production and/or injection system 20. For example, the computer system 10 may receive the second command to startup the fluid production and/or injection system 20 when the fluid production and/or injection system 20 is shutdown (e.g., as a result of receiving a third command to shutdown the fluid production and/or injection system 20). The computer system 10 may startup (block 186) the fluid production and/or injection system 20 (or send one or more instructions to startup the fluid production and/or injection system 20) using the one or more operational procedures and the one or more adjustments. For example, the computer system 10 may use the modified models that match the observed field response of the actual startup of the fluid production and/or injection system 20 and account for the discrepancy to determine one or more new operational procedures that are used to startup the fluid production and/or injection system 20.

By performing the method 170, the computer system 10 may dynamically model effects of operational procedures during the startup of the fluid production and/or injection system 20 at different times throughout the life of the field and update the operational procedures to account for changes in the field that may not have been accounted for earlier. For example, the operational procedures may be adjusted in real time based on sensor(s) 18 field data and/or measurements. In this manner, the method 170 may enable the computer system 10 to identify potential inefficiencies that may occur during startup and provide mitigation and/or operational procedures to be performed based on changing reservoir productivity and/or constraints imposed by a facility (e.g., a fixed or floating facility or an onshore installation) or a well or network.

Reference throughout this specification to "any embodiment," "an embodiment," "embodiments," "some embodiments," "certain embodiments," or similar language means that a particular feature, structure, or characteristic described in connection with the embodiment may be included in at least one embodiment of the present disclosure. Thus, these phrases or similar language throughout this specification may, but do not necessarily, all refer to the same embodiment. Although the present disclosure has been described with respect to specific details, it is not intended that such details should be regarded as limitations on the scope of the present disclosure, except to the extent that they are included in the accompanying claims.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. These techniques provide specific implementations of a solution to a problem, with respect to modeling startup of a fluid production and/or injection system in the software arts, for non-limiting example, by dynamically modeling effects of operational procedures during the startup of the production system at different times throughout the life of the field and updating the operational procedures to account for changes in the field that may not have been accounted for earlier. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method of modeling effects of operational procedures during startup of a fluid production or injection system at a field, comprising:

determining, via a processor, one or more initial conditions of the field at a first time based on one or more field measurements of the field;

simulating, via the processor, one or more startups of the fluid production or injection system based on the one or more initial conditions;

determining, via the processor, one or more operational procedures for starting up the fluid production or injection system based on the one or more simulated startups;

determining, via the processor, whether a startup command has been received; and startup the fluid production or injection system by instructing, via the processor, one or more valves of the fluid production or injection system to perform the one or more operational procedures when the startup command is received.

2. The method of claim 1, wherein the one or more field measurements comprise one or more flowrates.

3. The method of claim 2, where determining, via the processor, the one or more initial conditions of the field at the first time comprises:

generating a network model of a network of wells of the fluid production or injection system;

generating a reservoir model of a fluid reservoir;

generating an integrated model based on the network model and the reservoir model; and stepping through the integrated model to the first time to determine the initial conditions.

4. The method of claim 1, comprising:

determining, via the processor, whether one or more new field measurements of the field at a second time are available;

determining, via the processor, one or more new initial conditions of the field at the second time based on the one or more new field measurements of the field;

simulating, via the processor, one or more new startups of the fluid production or injection system based on the one or more new initial conditions; and determining, via the processor, one or more new operational procedures for starting up the fluid production or injection system based on the one or more new simulated startups; and starting up the fluid production or injection system by instructing, via the processor, the one or more valves of the fluid production or injection system to perform the one or more new operational procedures.

5. The method of claim 4, wherein the one or more operational procedures comprise a set of startup sequences for one or more wells of the subsea hydrocarbon production system.

6. The method of claim 4, wherein the one or more operational procedures comprise a set of startup sequences for one or more drill centers.

7. The method of claim 4, wherein the one or more operational procedures comprise a set of startup sequences for an amount of chemical injection used to mitigate hydrate formation within the subsea hydrocarbon production system.

8. The method of claim 4, wherein the one or more operational procedures comprise a set of startup sequences for one or more flow rates per well of the subsea hydrocarbon production system.

9. The method of claim 4, wherein the one or more operational procedures comprise a set of startup sequences associated with accumulation of a water, oil, or condensate in a pipeline of the subsea hydrocarbon production system.

10. The method of claim 4, wherein the one or more operational procedures comprise a set of startup sequences associated with a slug catcher of the subsea hydrocarbon production system.

11. A method of adjusting startup of a subsea hydrocarbon production system at a subsea field, comprising:

receiving, via a processor, a first command to startup the subsea hydrocarbon production system;

receiving, via the processor, one or more operational procedures for starting up the subsea hydrocarbon production system;

starting up the subsea hydrocarbon production system by instructing, via the processor, one or more valves of the subsea hydrocarbon production system to perform the one or more operational procedures when the first command is received;

simulating, via the processor, the startup of the subsea hydrocarbon production system in real time;

determining, via the processor, an error or difference between the simulated startup and the startup of the subsea hydrocarbon production system;

generating, via the processor, one or more adjustments to the one or more operational procedures based on the error or difference, wherein the one or more adjustments are configured to match the simulated startup to the startup of the subsea hydrocarbon production system;

receiving, via the processor, a second command to startup the subsea hydrocarbon production system when the subsea hydrocarbon production system is shutdown; and starting up the subsea hydrocarbon production system by instructing, via the processor, the one or more valves of the subsea hydrocarbon production system to perform the one or more operational procedures and the one or more adjustments when the second command is received.

12. The method of claim 11, wherein simulating, via the processor, the startup of the subsea hydrocarbon production system in real time comprises:

generating, via the processor, a field layout design of the subsea field;

generating, via the processor, a field development plan of the subsea field;

generating, via the processor, valve information of the one or more valves of the subsea hydrocarbon production system;

generating, via the processor, a dynamic network model based at least in part on the field layout design, the field development plan, and the valve information, wherein the dynamic network model is configured to evaluate a network of wells of the subsea hydrocarbon production system over time;

generating, via the processor, a reservoir model of a hydrocarbon reservoir of the subsea field;

generating, via the processor, an integrated dynamic model of the subsea field based at least in part on the dynamic network model and the reservoir model, wherein the integrated dynamic model is configured to evaluate the subsea field over time; and simulating, via the processor, the startup of the subsea hydrocarbon production system using the integrated dynamic model.

13. A tangible, non-transitory, machine-readable medium, comprising machine-readable instructions to cause one or more processors to:

determine one or more initial conditions of a subsea field at a first time based on one or more field measurements of the subsea field;

simulate one or more startups of a subsea hydrocarbon production system at the subsea field based on the one or more initial conditions;

determine one or more operational procedures for starting up the subsea hydrocarbon production system based on the one or more simulated startups;

receive a first command to startup the subsea hydrocarbon production system;

start up the subsea hydrocarbon production system by instructing one or more valves of the subsea hydrocarbon production system to perform the one or more operational procedures when the first command is received;

simulate the startup of the subsea hydrocarbon production system in real time;

determine an error between the simulated real time startup and the startup of the subsea hydrocarbon production system;

generate one or more adjustments to the one or more operational procedures based on the error;

receive a second command to startup the subsea hydrocarbon production system when the subsea hydrocarbon production system is shutdown; and start up the subsea hydrocarbon production system by instructing the one or more valves of the subsea hydrocarbon production system to perform the one or more operational procedures and the one or more adjustments when the second command is received.

14. The machine-readable medium of claim 13, wherein simulating the one or more startups of the subsea hydrocarbon production system comprises instructions to cause the one or more processors to:

generate a field layout design of the subsea field;

generate a field development plan of the subsea field;

generate valve information of the one or more valves of the subsea hydrocarbon production system;

generate a dynamic network model based at least in part on the field layout design, the field development plan, and the valve information, wherein the dynamic network model is configured to evaluate of a network of one or more wells of the subsea hydrocarbon production system over time;

generate a reservoir model of a hydrocarbon reservoir of the subsea field;

generate an integrated dynamic model of the subsea field based at least in part on the one or more initial conditions, the dynamic network model, and the reservoir model, wherein the integrated dynamic model is configured to evaluate the subsea field over time; and simulate one or more startups of the subsea hydrocarbon production system using the integrated dynamic model.

15. The machine-readable medium of claim 14, wherein the field layout design comprises one or more drill center locations, a number of pipes used to transfer hydrocarbons from the network of one or more wells of the subsea hydrocarbon production system to one or more processing facilities, or any combination thereof.

16. The machine-readable medium of claim 14, wherein the field development plan comprises sizes of the pipes used to transfer hydrocarbons from the network of one or more wells of the subsea hydrocarbon production system to the one or more processing facilities, sizes of risers of the subsea hydrocarbon production system, sizes of one or more separators of the subsea hydrocarbon production system, a drilling or hydrocarbon production strategy that depletes the hydrocarbon reservoir and increases hydrocarbon production, or any combination thereof.

17. The machine-readable medium of claim 14, wherein the valve information comprises sizes of the one or more valves, stroke times of the one or more valves, or any combination thereof.

18. The machine-readable medium of claim 17, wherein the valve information is determined for each valve of the one or more valves of the subsea hydrocarbon production system.

19. The machine-readable medium of claim 14, wherein generating the one or more adjustments to the one or more operational procedures comprises modifying the integrated dynamic model to match an observed field response of the startup of the subsea hydrocarbon production system and accounting for the error.

20. The machine-readable medium of claim 13, comprises instructions to cause the one or more processors to:

determine whether one or more new field measurements of the subsea field are available;

determine one or more new initial conditions of the subsea field at a second time based on one or more new field measurements of the subsea field;

simulate one or more new startups of the subsea hydrocarbon production system at the subsea field based on the one or more new initial conditions; and determine one or more new operational procedures for starting up the subsea hydrocarbon production system based on the one or more new simulated startups.

* * * * *